(12) United States Patent
Cabral, Jr. et al.

(10) Patent No.: US 9,738,560 B2
(45) Date of Patent: Aug. 22, 2017

(54) CONTROLLING FRAGMENTATION OF CHEMICALLY STRENGTHENED GLASS

(71) Applicant: International Business Machines Corporation, Armonk, NY (US)

(72) Inventors: Cyril Cabral, Jr., Mahopac, NY (US);
Fuad E. Doany, Katonah, NY (US);
Gregory M. Fritz, Wakefield, MA (US); Michael S. Gordon, Yorktown Heights, NY (US); Qiang Huang, Croton on Hudson, NY (US); Eric P. Lewandowski, Morristown, NJ (US);
Xiao Hu Liu, Briarcliff Manor, NY (US); Kenneth P. Rodbell, Sandy Hook, CT (US); Thomas M. Shaw, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/163,260

(22) Filed: May 24, 2016

(65) Prior Publication Data

US 2016/0264456 A1    Sep. 15, 2016

Related U.S. Application Data

(63) Continuation of application No. 14/700,877, filed on Apr. 30, 2015, now Pat. No. 9,586,857.
(Continued)

(51) Int. Cl.
*C03C 17/06* (2006.01)
*C03C 15/00* (2006.01)
(Continued)

(52) U.S. Cl.
CPC ............ *C03C 17/06* (2013.01); *C03B 23/203* (2013.01); *C03C 15/00* (2013.01); *C03C 17/34* (2013.01);
(Continued)

(58) Field of Classification Search
CPC ....... C03C 17/06; C03C 17/34; C03B 23/203; C03B 15/00
See application file for complete search history.

(56) References Cited

U.S. PATENT DOCUMENTS 4,076,863 A    2/1978 Onoki et al.
4,128,690 A   12/1978 Boardman et al.
(Continued)

FOREIGN PATENT DOCUMENTS

EP    0884286 A2   12/1998
EP    0884286 A3    6/1999
(Continued)

OTHER PUBLICATIONS

Glass et al., "Stressed Glass Technology for Actuators and Removable Barrier Applications," Sandia Report, Sandia National Laboratories, 2007, 18 pages, Albuquerque, NM and Livermore, CA.
(Continued)

*Primary Examiner* — Duy Deo
*Assistant Examiner* — Mahmoud Dahimene
(74) *Attorney, Agent, or Firm* — Robert J. Shatto

(57) ABSTRACT

A method of manufacturing a glass substrate to control the fragmentation characteristics by etching and filling trenches in the glass substrate is disclosed. An etching pattern may be determined. The etching pattern may outline where trenches will be etched into a surface of the glass substrate. The etching pattern may be configured so that the glass substrate, when fractured, has a smaller fragmentation size than chemically strengthened glass that has not been etched. A mask
(Continued)

may be created in accordance with the etching pattern, and the mask may be applied to a surface of the glass substrate. The surface of the glass substrate may then be etched to create trenches. A filler material may be deposited into the trenches.

20 Claims, 9 Drawing Sheets

Related U.S. Application Data

(60) Provisional application No. 62/080,586, filed on Nov. 17, 2014.

(51) Int. Cl.
        C03C 23/00        (2006.01)
        C03B 23/203       (2006.01)
        G03F 7/20         (2006.01)
        C03C 17/34        (2006.01)
        C03C 21/00        (2006.01)
        C03C 27/06        (2006.01)

(52) U.S. Cl.
      CPC ........ *C03C 21/002* (2013.01); *C03C 23/0055* (2013.01); *C03C 27/06* (2013.01); *G03F 7/20* (2013.01); *C03C 2217/252* (2013.01); *C03C 2217/261* (2013.01); *C03C 2218/32* (2013.01); *C03C 2218/328* (2013.01); *C03C 2218/34* (2013.01)

(56) References Cited

U.S. PATENT DOCUMENTS

| | | | |
|---|---|---|---|
| 4,400,194 | A | 8/1983 | Starr |
| 6,180,237 | B1 | 1/2001 | Kato et al. |
| 6,200,665 | B1 | 3/2001 | Seto |
| 6,881,485 | B2 | 4/2005 | Kato et al. |
| 2010/0013043 | A1* | 1/2010 | Liu ................... H01L 23/3171 257/491 |
| 2010/0291353 | A1 | 11/2010 | Dejneka et al. |
| 2011/0201490 | A1 | 8/2011 | Barefoot et al. |
| 2012/0135226 | A1 | 5/2012 | Bookbinder et al. |
| 2012/0135852 | A1 | 5/2012 | Ellison et al. |
| 2012/0135853 | A1 | 5/2012 | Amin et al. |
| 2012/0277085 | A1 | 11/2012 | Bookbinder et al. |
| 2012/0282449 | A1 | 11/2012 | Gross |
| 2013/0045375 | A1 | 2/2013 | Gross |
| 2013/0059157 | A1 | 3/2013 | Bookbinder et al. |
| 2013/0122284 | A1 | 5/2013 | Gross |
| 2013/0122306 | A1 | 5/2013 | Bookbinder et al. |
| 2013/0122313 | A1 | 5/2013 | Gross |
| 2013/0224492 | A1 | 8/2013 | Bookbinder et al. |
| 2013/0236666 | A1 | 9/2013 | Bookbinder et al. |
| 2014/0141226 | A1 | 5/2014 | Bookbinder et al. |
| 2014/0329660 | A1 | 11/2014 | Barefoot et al. |
| 2014/0338820 | A1 | 11/2014 | Chen et al. |
| 2014/0342123 | A1 | 11/2014 | Chen et al. |
| 2014/0342897 | A1 | 11/2014 | Amin et al. |
| 2014/0361273 | A1* | 12/2014 | Nozawa ............. H01L 51/524 257/40 |
| 2014/0370302 | A1 | 12/2014 | Amin et al. |
| 2015/0037586 | A1 | 2/2015 | Gross |
| 2015/0064474 | A1 | 3/2015 | Dejneka et al. |
| 2016/0137548 | A1 | 5/2016 | Cabral, Jr. et al. |

FOREIGN PATENT DOCUMENTS

| | | |
|---|---|---|
| EP | 0884286 B1 | 1/2004 |
| JP | 58091042 A | 5/1983 |
| JP | 2000103632 A | 4/2000 |

OTHER PUBLICATIONS

Glass et al., "Processing and Properties of Ion Exchanged Glasses," Glass and Optical Materials Division Fall Meeting, Sandia National Laboratories, Nov. 6-12, 2004, 33 pages, Cape Canaveral, FL.

Gross et al., "Sharp Contact Damage in Ion-Exchanged Cover Glass," Functional Glasses: Properties and Applications for Energy and Information, Corning, Jan. 6-13, 37 pages, Siracusa, Sicily, Italy, © Corning Incorporated 2013.

Lee et al., "Glass Thickness and Fragmentation Behavior in Stressed Glasses," Scientific Research, New Journal of Glass and Ceramics, 2012, pp. 116-121 doi:10.4236/njgc.2012.24020 Published Online Oct. 2012 (http://www.SciRP.org/journal/njgc).

Cabral Jr. et al., "Triggering Fragmenting Substrates," U.S. Appl. No. 62/080,586, filed Nov. 17, 2014.

Shaw et al., "VAPR Using COTS State of the Art Devices," R&D Final Report, IBM Vanishing Programmable Resources, Jan. 19, 2015, DARPA Microsystems Technology Office, Issued by DARPA/CMO under Contract No. HR0011-14-C-0006.

List of IBM Patents or Patent Applications Treated as Related, May 17, 2016, 2 pgs.

\* cited by examiner

CONTROLLING FRAGMENTATION OF CHEMICALLY STRENGTHENED GLASS

STATEMENT REGARDING FEDERALLY SPONSORED RESEARCH OR DEVELOPMENT

This invention was made with Government support under contract number HR0011-14-C-0006 awarded by Defense Advanced Research Projects Agency. The Government has certain rights to this invention.

BACKGROUND

The present disclosure relates generally to the field of material science, and more particularly to controlling fragmentation characteristics of chemically strengthened glass.

Highly stressed glass has been known to fragment into small pieces since the Royal Society of London studied the phenomenon known as Prince Rupert's drops in the 17$^{th}$ and 18$^{th}$ centuries. There are several ways to create highly stressed glass. For example, tempered glass is a type of highly stressed glass that is made using thermal treatments. Tempering the glass puts the outer surfaces into compression and the inner surfaces into tension. The glass is placed onto a roller table, taking it through a furnace that heats it well above its transition temperature. The glass is then rapidly cooled with forced air drafts while the inner portion remains free to flow for a short time. The outer layer wants to shrink as it is quickly cooled due to the glass's thermal expansion coefficient, but is unable to due to the higher temperature of the inner portion. This causes the outer layer to have large residual compressive stresses. As the interior of the glass slowly cools, it also wants to shrink due to the material's thermal expansion coefficient. Because the outer layer has solidified into shape, the inner region is unable to shrink. This causes the inner region to have large residual tensile stresses.

Another common way to create highly stressed glass, particularly for soda lime glass, is using chemical treatments, such as an ion exchange process. A commonly used ion exchange process for soda lime glass is a potassium and sodium (K/Na) ion exchange process. Unstressed glass is submerged in a bath containing a potassium salt, typically potassium nitrate ($KNO_3$), at an elevated temperature. The sodium ions at the surface of the glass are replaced by potassium ions from the potassium nitrate. Because the potassium ions are roughly 30% larger than the sodium ions, the surface of the glass is put into a compressive state. The surface compression is balanced by residual internal tensile stresses. The exchange depth and the number of sodium ions replaced by potassium ions determine the compressive layer depth and the magnitudes of the compressive and tensile stresses.

Chemically strengthened glass' properties may be modified using ion irradiation. Ion irradiation (also referred to herein as ion beam irradiation) uses particle accelerators to emit charged particles (ions) towards a material to modify the material's properties. There are several types of ion irradiation techniques. One type, commonly used in semiconductor fabrication and the manufacture of silicon integrated circuits, is referred to as ion implantation.

In ion implantation, the ions may, depending on the energy at which they are emitted towards the material, penetrate the material to a depth before becoming stopped in the material ("implanted"), acting as an impurity. The ions may alter the elemental composition of the target. They also may cause many chemical and physical changes in the material by transferring their energy and momentum to the electrons and atomic nuclei of the target material. This may cause a structural change, in that the crystal structure of the target can be damaged or even destroyed by the energetic collision cascades. Because the ions have masses comparable to those of the target atoms, they knock the target atoms out of place more than electron beams do. If the ion energy is sufficiently high (usually tens of MeV) to overcome the coulomb barrier, there can even be a small amount of nuclear transmutation.

SUMMARY

Embodiments of the present invention disclose a method of manufacturing a chemically strengthened glass substrate to control the fragmentation characteristics of the glass substrate. In an embodiment, this disclosure includes a method for controlling the fragmentation characteristics by etching and filling trenches in a glass substrate. The method may include determining an etching pattern. The etching pattern outlines where trenches will be etched into a surface of the glass substrate. The etching pattern may be configured so that the glass substrate, when fractured, has a smaller fragmentation size than unprocessed, chemically strengthened glass. A mask may be created in accordance with the etching pattern, and the mask may be applied to a surface of the glass substrate. The surface of the glass substrate may then be etched to create trenches. After the trenches are etched, the method may include depositing a filler material into the trenches.

In another embodiment, this disclosure includes a method for controlling the fragmentation characteristics of a glass substrate by masking and irradiating the substrate using an ion beam. The method may include determining an irradiation pattern. The irradiation pattern may outline which areas of the glass substrate will be damaged by ion irradiation and which areas will be shielded from the ion beam. The irradiation pattern may be configured so that the glass substrate, when fractured, has a smaller fragmentation size than chemically strengthened glass that has not been irradiated. A mask may be created in accordance with the irradiation pattern, and the mask may be applied to a surface of the glass substrate. An ion beam may be raster-scanned across the surface of the glass substrate to generate regions of damaged glass.

In another embodiment, this disclosure includes a method for controlling the fragmentation characteristics of a glass substrate by selectively depositing a metal on top of the substrate using a photolithography process. A deposit pattern may be determined. The deposit pattern may outline which areas of the surface of the glass substrate will have a metal deposited on them. The deposit pattern may be configured so that the glass substrate, when fractured, has a smaller fragmentation size than chemically strengthened glass without metals deposited on top. A layer of metal may be deposited on a surface of the glass substrate. A mask may be created in accordance with the deposit pattern, and the mask may be applied on top of the metal layer. The metal may then be patterned according to the deposit pattern using a photolithography process.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present invention and, along with the description, serve to explain the principles of the invention. The drawings are only illustrative of typical embodiments of the invention and do not limit the invention.

Figure 1:
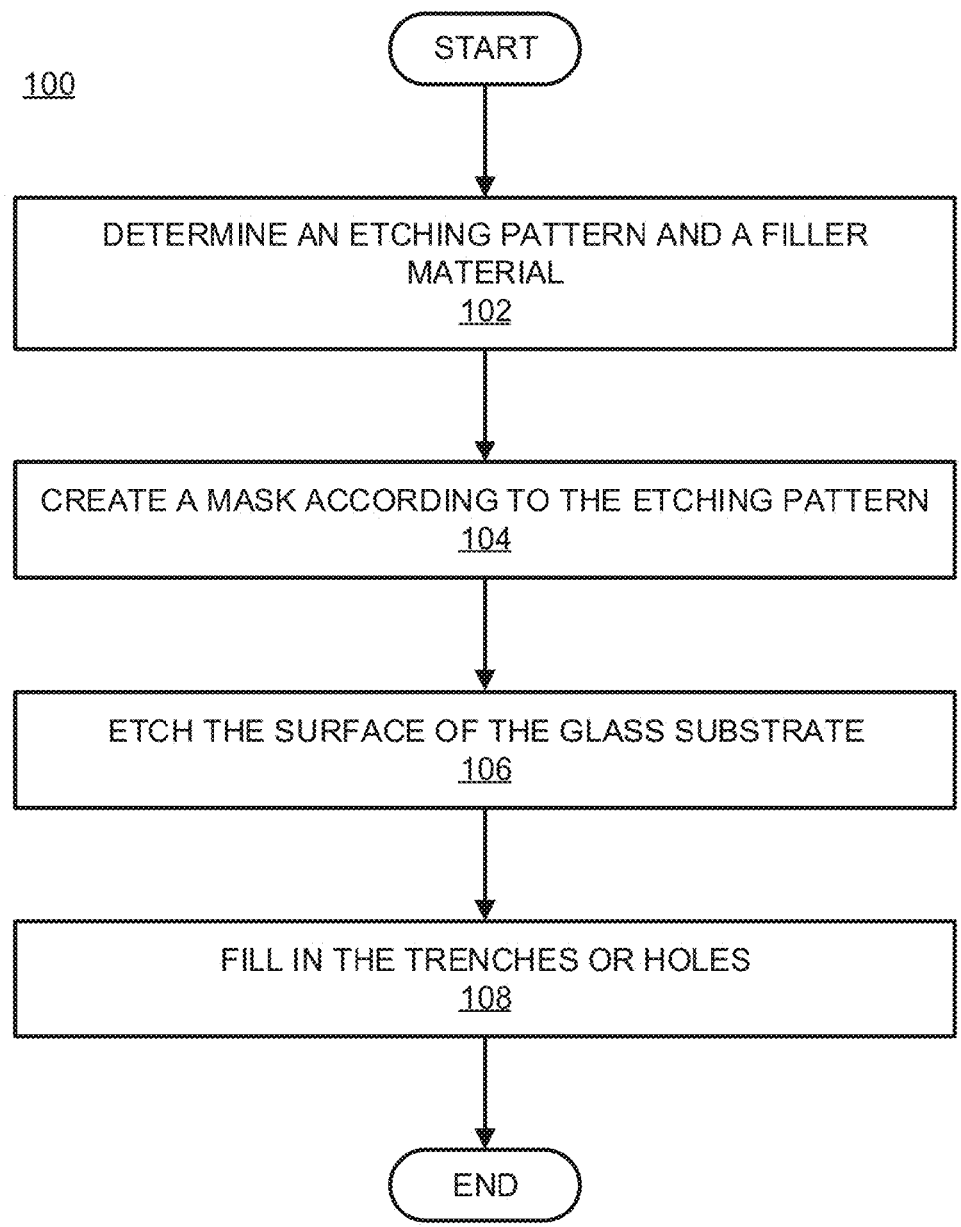
FIG. 1 illustrates a flowchart of an example method of manufacturing a chemically strengthened glass substrate to control the fragmentation characteristics of the glass substrate by etching trenches into the glass substrate and then filling the trenches, in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention

DETAILED DESCRIPTION

The present disclosure relates generally to the field of material science, and more particularly to controlling fragmentation characteristics of chemically strengthened glass. While the present disclosure is not necessarily limited to such applications, various aspects of the disclosure may be appreciated through a discussion of various examples using this context.

The basic mechanism by which fragmentation occurs has only recently been understood using the framework of fracture mechanics. The fragmentation phenomenon relies on the glass having an interior region in a highly tensile state contained within an exterior that is compressively stressed. If a flaw is introduced into the tensile region of the glass, the glass experiences a large mode I crack driving force due to the release of strain energy from the stressed region. The high strain energy release rate causes a tensile crack to advance through the glass at speeds approaching the speed of sound. As the crack propagates through the glass, it bifurcates due to the interaction between the stress field in front of the crack and stress waves. The more often the crack bifurcates, the smaller the fragments will be.

The crack propagation may have two components. The crack may tunnel through the bulk of the material, and the crack may travel towards the surface of the material. For chemically strengthened glass, the crack front tunneling through the bulk of the material experiences a high, and mostly constant, crack driving force through the tensile region of the substrate. This allows it to propagate at a relatively steady velocity, close to the speed of sound, and allows it to branch and create a network of cracks in the tensile region of the substrate.

The crack front moving towards the surface of the substrate, however, experiences a varying stress field due to the transition from a tensile stress region near the center of the substrate to a compressive stress region near the surface of the substrate. The large residual compressive stresses in the region near the surface of the substrate cause the crack driving force to decrease as the crack approaches the surface, and the crack's propagation may be slowed or halted in this direction. The rate at which the crack bifurcates as it approaches the surface may also decrease. Due to this phenomenon, referred to herein as "crazing," it becomes difficult to decrease the size of the glass fragments by increasing the residual tensile stresses through a prolonged ion exchange process because extending the ion exchange process also increases the residual compressive stresses and the size of the compressive stress region.

As used herein, the "fragmentation characteristics" of a glass substrate describe how the glass fragments when fractured. Fragmentation characteristic include, e.g., the size, shape, and distribution of fragments of glass during and after fracturing. The "fragmentation size" is a fragmentation characteristic pertaining to the width of the fragments of the glass substrate upon fracturing. The fragmentation size may be the average of the largest linear widths of the fragments created by the fracturing of the glass substrate. For example, a rectangular fragment of glass with a first edge being 250 microns wide, and a second edge being 100 microns wide will have a fragment width of roughly 269 microns because that is the largest distance across a surface of the glass substrate, in this case from corner to opposite corner. Fragmentation characteristics of chemically strengthened glass can be controlled by altering the glass's stress field. As discussed herein, various techniques are disclosed to produce an inhomogeneous stress field in the chemically strengthened glass to control the fragmentation characteristics of the glass. By altering the stress field within the glass, the frequency of the crack bifurcation may be increased to cause the glass to fragment into smaller pieces.

A "stress field" describes the magnitude and type of stress (e.g., compressive, tensile) throughout a body, or throughout a region of a body. An "inhomogeneous stress field" is a stress field where the stresses within a material are not uniform. For example, a chemically strengthened glass substrate may have surfaces in compression while the bulk of the material is in tension. The stress field for the chemically strengthened glass substrate may be considered inhomogeneous because the stresses throughout the glass substrate are not the same.

Residual stresses are stresses that remain in a solid material after the original cause of the stresses has been removed. Residual stresses may be compressive or tensile. A material has a "residual compressive stress" if a region of the material continues to be in compression after the stressor is removed. A material has a "residual tensile stress" if a region of the material continues to be in tension after the stressor is removed. Residual stresses may affect the properties of the material, and may be desirable or undesirable. For example, residual compressive stresses tend to increase the strength of a material, while residual tensile stresses tend to increase the crack driving force in a material during fracture. Some solid materials, such as chemically strengthened glass, have both residual compressive and tensile stresses.

FIG. 1 illustrates a flowchart of an example method 100 of manufacturing a chemically strengthened glass substrate to control the fragmentation characteristics of the glass substrate by etching trenches into the glass substrate and then filling the trenches, in accordance with embodiments of the present disclosure. In some embodiments, the method 100 may be performed on a glass substrate prior to the glass substrate being chemically strengthened using an ion exchange process. The method 100 may begin at operation 102, wherein an etching pattern and a filler material are determined. The etching pattern defines the locations of trenches and/or holes in the glass substrate. The etching pattern may be configured in conjunction with the filler material to control the fragmentation characteristics of the chemically strengthened glass. For example, the etching pattern and filler material may be chosen to minimize the fragmentation size of the glass substrate. The fragmentation characteristics of the glass are controlled by modifying the stress field within the glass substrate.

The filler material may be chosen in conjunction with the etching pattern to alter the stress field within the glass substrate. The filler material may be any material that can be deposited into the trenches, such as metals, ceramics, other types of glass, or chemically reactive materials. The etching pattern and filler material may be chosen together because some etching patterns will be particularly effective when paired with complementary filler materials. For example, the etching pattern that is effective when depositing a metal in the trenches may not work as well when chemically reactive materials are deposited in the trenches.

The etching pattern may be determined according to the intended use of the glass. In some embodiments, the etching pattern may be chosen to limit the crazing effects by reducing the thickness of the compressive stress region at specific places in the glass substrate. In these embodiments, the etching pattern may cause most of the surface of the glass to be etched to reduce the thickness of compressive stress region. Only smaller areas of the glass, such as where the high strength created by the compressive stress region is needed to, e.g., support a chip or semiconductor, may be masked. The rest of the glass may be etched, thereby causing it to fracture into smaller fragments. In some embodiments, such as where a planar glass substrate will be supported along its perimeter, as in a car window, the etching pattern may involve masking the edges of the glass and etching the rest of the planar surface. This may preserve the higher strength along the edges of the glass, while still causing the central region of the glass to fragment into smaller pieces when fractured.

In embodiments where a metal filler is used, several etching patterns may reduce the fragmentation size of the glass. In some embodiments, an etching pattern which may reduce the fragmentation size of the glass may include parallel trenches across the surface of the glass substrate. By adjusting the spacing between, and the thickness of, the trenches, as well as the filler metal used, the fragment size of the glass substrate may be controlled. For example, reducing the spacing between the trenches may reduce the fragmentation size. For some metals, there may be a critical spacing length, which is the trench spacing that results in the smallest fragmentation size for a glass substrate. For example, a glass substrate with trenches 20 micrometers apart may have the smallest fragmentation size when the trenches are filled with aluminum. Trench spacing that is greater than or less than the critical spacing length may result in larger fragmentation size than trench spacing at the critical spacing length.

Likewise, for some metal fillers, glass with narrower (and more frequent) trenches may have a reduced fragmentation size when compared to glass with wider trenches. As with the trench spacing, there may be a critical trench width, which is the trench width that results in the smallest fragmentation size for a glass substrate. For example, glass substrates with trench widths of 15 micrometers may have the smallest fragmentation size when the filler material is aluminum. Glass substrates with wider or narrower trench widths may have a larger fragmentation size than glass with trench widths at the critical trench width.

In some embodiments, the etching pattern may include etching trenches in the shape of disconnected features into the surface of the glass substrate. The disconnected features may be open features (such as zig-zag or c-shaped patterns) or closed features (such as a rectangle or a star). The features may be considered disconnected because the trenches that define the features do not cross or touch neighboring features' trenches. Not only can the trenches reduce the compressive stresses as previously discussed, the use of a disconnected feature, such as a star, may help to increase the bifurcation of the crack.

For example, assume that a five-point star is etched into the surface of a glass substrate. As a crack propagates through the substrate, it may intersect the star. The crack may then follow the edges of the star, cracking outward every time it reaches a point in the star, which may act like a stress concentration point. Accordingly, by changing the number of points in the star and the size of the star, the frequency of the crack bifurcation may be controlled. Decreasing the size of the star or increasing the number of points in the star may reduce the fragmentation size of the glass substrate.

In some embodiments, disconnected features may be etched into the surface in order to control the fragmentation shape of the glass. Shapes like rectangles or stars may be etched into the glass surface so that, upon fracturing, the fragments are shaped like the features, e.g., like a rectangle or star. Controlling the shape of the fragmentation may make it easier to separate the fractured glass from its environment. For example, chemically strengthened glass may be used in a pipe to hold back the flow of a fluid, such as seawater at a water desalination plant, until the pipe is connected to the desalination equipment and the plant is ready to being operations. At that point, the glass may be intentionally broken (e.g., by increasing the water pressure in the pipe). The glass may then be filtered out of the water, and by controlling the shape of the fragments of glass, it may be easier or cheaper to filter the majority of the glass out of the water.

In some embodiments, the etching pattern may be chosen to limit the crazing effects by reducing the magnitude of the compressive stresses at the surface of the glass. For example, a metal may be deposited into the trenches at a high temperature, allowing the metal to bond with the glass substrate at the boundaries between the metal and glass (e.g., at the trench walls and along the bottom of the trench). Because the trenches were etched into the compressive region of the chemically strengthened glass, the trench walls may have residual compressive stresses when the metal is deposited into the trenches. The metal may then be allowed to cool, which may cause the metal to contract. As the metal contracts, it may pull on the walls of the trenches in a direction towards the contracting metal (e.g., towards the center of the trench). This may create tensile stresses along the trench walls. The tensile stresses may counter and reduce the residual compressive stresses that originally resided in the trench walls. By decreasing the magnitude of the compressive stresses, the crazing effects responsible for larger fragmentation sizes when the glass fractures may be reduced.

In some embodiments, the trenches in the glass may be filled with a composition of two or more chemically reactive materials. In some embodiments, the chemically reactive compound may be layered inside the trenches. For example, alternating layers of elemental aluminum and nickel may be deposited in the trenches. A reaction between the aluminum and nickel may be initiated by heating the glass. In embodiments, the reaction may be initiated by inserting a filament into the trenches with the aluminum and nickel, and then heating the filament by running a current through it.

The thermal pulse created by igniting the chemically reactive compounds may be used to change the stress field within the glass. When the chemically reactive compound is ignited, it may produce heat and/or change volume. The reaction may locally heat the glass, relieving or decreasing the residual stresses in the heated portion of the glass. This may be particularly advantageous in the compressively stressed layers of the glass, as residual compressive stresses can inhibit fracturing of the glass, causing fragments to be larger than desired. By combining the chemically reactive material with an appropriate etching pattern, the compressive stresses in specific parts of the glass may be relieved and the fragmentation characteristics of the glass may be controlled.

In some embodiments, the volumetric change that some chemically reactive materials undergo during the chemical reaction may be used to alter the stress field inside the glass. For example, the products of the reaction may have a smaller volume than the reactants. Accordingly, when the reactants, which are bound or fused with the walls of the trenches, undergo the chemical reaction, the volume of the material inside the trenches may decrease. This, in turn, may cause the products of the reaction to pull on the walls of the trenches, creating tensile stresses at the trench walls. The tensile stresses may counter and reduce the residual compressive stresses that originally resided in the trench walls.

Because the magnitude of the compressive tensile stresses may be reduced, the crazing effects may be reduced. This may allow a crack to propagate faster and further in the compressive stress region, which in turn may increase the rate of bifurcation of the crack, leading to a smaller fragmentation size. This may be a particularly advantageous method because the change in the volume of the filler materials that may result from a chemical reaction may be upwards of 10% or more, while the change in volume from increasing the temperature of a metal may be closer to 1% or 2%. Accordingly, the use of chemically reactive materials may better relieve the compressive stresses than simply depositing a metal in the trenches does.

In some embodiments, the rapid expansion of gasses released during some chemical reactions may be used to alter the stress field inside the glass. As the gasses expand, they create a pressure on the walls of the trenches. This pressure may impart additional residual stresses on the glass. By carefully controlling where the pressure will impart residual stresses through selectively etching the surface of the glass substrate, the stress field within the glass may be modified. This may be particularly advantageous when larger fragmentation sizes are desired because the expanding gasses may increase the magnitude of the residual compressive stresses near the surface of the glass. In some embodiments, the expansion of the gasses may be strong enough to fracture the glass, and igniting the chemically reactive compounds may be done to intentionally initiate fragmentation.

In some embodiments, it may be advantageous to increase the fragmentation size of a chemically strengthened glass substrate. In these cases, the trenches may be etched such that they form a cross or mesh-like pattern. The width of the trenches, spacing between parallel trenches, angles of intersection of trenches, and area of the gaps created by the mesh pattern may all be considered when determining an etching pattern. A mesh-like etching pattern allows crack propagation to be directed towards metal at a roughly orthogonal angle, which can be used to stop the crack from continuing on or bifurcating further. Accordingly, the size of the fragments of glass can be made larger than normally produced by chemically strengthened glass with the same residual tensile stresses.

Parallel trenches may be particularly useful in controlling the distribution of fragmentation sizes. Unlike with disconnected features, which may be difficult to uniformly pattern across the surface of the glass, parallel lines can be uniformly distributed across the surface of the glass substrate. This may change the distribution of the fragmentation sizes such that a higher percentage of glass fragments are at or near a desired size, while the range and standard deviation of the size of individual glass fragments may be smaller.

In some embodiments, the trenches may be filled with a thermally mismatched filler material to increase the fragmentation size of the glass. The filler material may have a larger thermal expansion coefficient than the glass so that it expands and contracts with changing temperatures at an increased rate, and to a larger extent, than the glass itself. The material may also have a higher Young's modulus, meaning that the material is more rigid than the glass. As the temperature increases, the filler material expands. As the filler material expands (and in turn resists the expansion of the glass), it may create a pressure along the walls of the trenches. This pressure may change the stress field within the glass substrate, particularly at or near the trench walls, by increasing the residual compressive stresses. Accordingly, the fragmentation size of the glass substrate may be increased. In some embodiments, the expansion of the filler material may be large enough to cause the glass substrate to fracture. This may be intentionally selected to initiate fragmentation of the glass substrate when the glass reaches a certain temperature. For example, a glass substrate with a current-carrying wire running through it may be fractured when the glass reaches a specific temperature. This may be used to, e.g., trigger an alarm.

After determining the etching pattern and filler material at operation 102, a mask may be created according to the etching pattern at operation 104. The material that the mask is made out of may depend on the etching technique employed. For example, if the glass will be etched by submersion in a concentration of buffered hydrofluoric acid, the mask may be made out of a material resistant to corrosion in hydrofluoric acid.

After creating a mask at operation 104, the mask may be applied to a surface of the glass substrate, and the portions of the substrate not protected by the mask may be etched at operation 106. Any method of etching glass may be used. For example, the glass may be etched using a liquid ("wet") etching technique, such as by submerging the masked glass in a concentration of hydrofluoric acid. Glass may also be etched using a plasma ("dry") etching process. Dry etching processes that may be employed include ion milling (also known as sputter etching), reactive-ion etching (RIE), and deep reactive-ion etching (DRIE). In some embodiments, the glass may be etched using a mechanical finishing process, such as by sandblasting or milling.

After applying the mask and etching trenches into the chemically strengthened glass at operation 106, the trenches may be filled with the filler material at operation 108. The trenches may be filled using any technique for depositing the filler material into the trenches. For example, a thin-film deposition process, such as an evaporation process, where the filler material is evaporated and then condenses back to a solid state, may be used. After the trenches have been filled at operation 108, the method 100 may end.

Figure 2A:
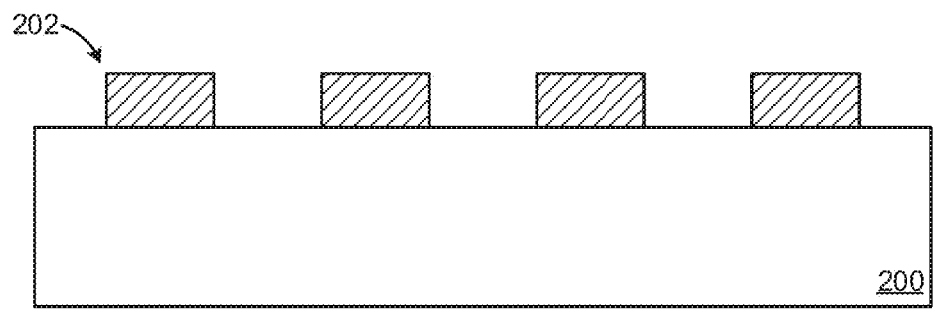
FIGS. 2A-C illustrate chemically strengthened glass being etched according to a pattern to control the fragmentation characteristics of the glass, in accordance with embodiments of the present disclosure.
Figure 2B:
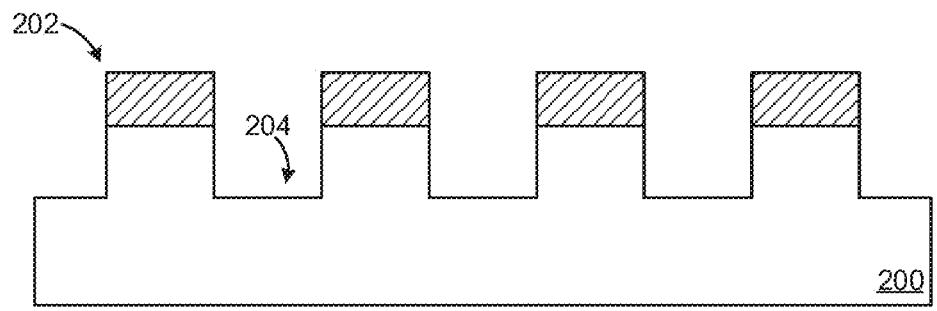
Figure 2C:
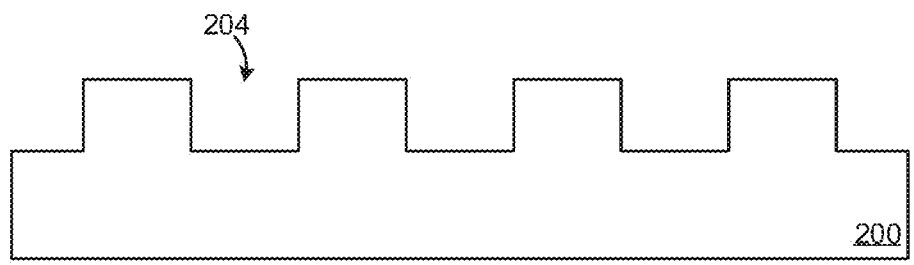

FIGS. 2A-C illustrate chemically strengthened glass 200 being etched according to an etching pattern to control the fragmentation characteristics of the glass, in accordance with embodiments of the present disclosure. The chemically strengthened glass 200 may be made using any chemical strengthening process. For example, the chemically strengthened glass may be made using an ion exchange process, such as a K/Na ion exchange process that replaces sodium ions in the surface of the glass with larger potassium ions when soda lime glass is placed in potassium nitrate ($KNO_3$). In some embodiments, the ion exchange process used to strengthen the glass 200 may involve replacing the sodium ions with some other ions, such as rubidium ions.

As shown in FIG. 2A, a mask 202 may be created to pattern the glass 200 to create an inhomogeneous stress field inside the glass. The pattern of the mask 202 may be chosen to create an inhomogeneous stress field that results in the desired fragmentation characteristics of the glass. The mask 202 may be applied to the surface of the glass 200. As shown in FIG. 2B, the unmasked portion of the glass may then be etched using any glass etching process, such as those examples given in reference to FIG. 1. The etching process may create a plurality of trenches or holes 204. After the glass 200 has been etched and a plurality of trenches 204 have been created, the mask 202 may be removed from the glass, leaving behind an etched glass surface as shown in FIG. 2C.

Figure 3A:
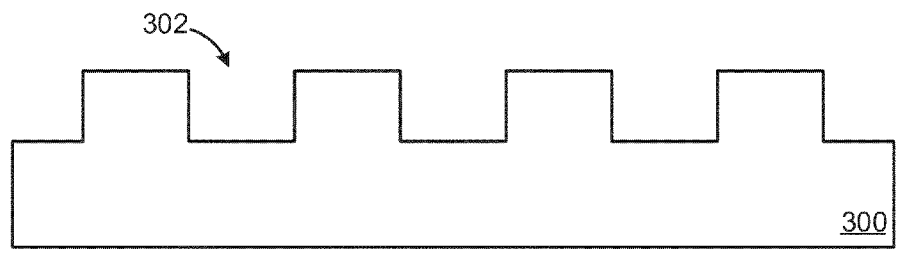
FIGS. 3A-C illustrate the trenches of etched chemically strengthened glass being filled with a metal to control the fragmentation characteristics of the glass, in accordance with embodiments of the present disclosure.
Figure 3B:
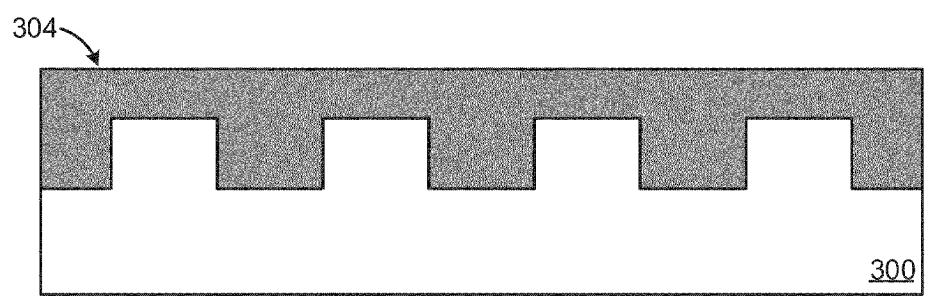
Figure 3C:
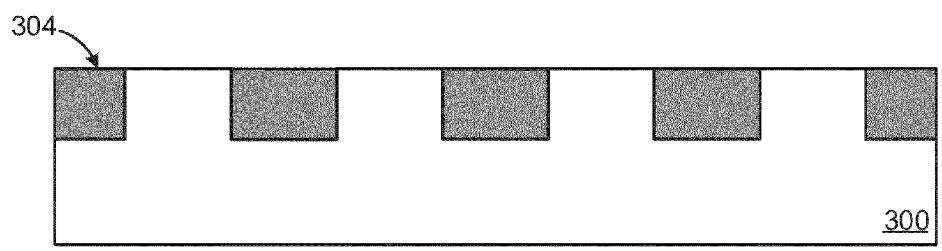

FIGS. 3A-C illustrate the trenches 302 of etched, chemically strengthened glass 300 being filled with a metal to control the fragmentation characteristics of the glass, in accordance with embodiments of the present disclosure. The chemically strengthened glass 300 may be made using any chemical strengthening process. For example, the chemically strengthened glass may be made using an ion exchange process, such as a K/Na ion exchange process that replaces sodium ions in the surface of the glass with larger potassium ions when soda lime glass is placed in potassium nitrate ($KNO_3$). In some embodiments, the ion exchange process used to strengthen the glass 300 may involve replacing the sodium ions with some other ions, such as rubidium ions.

As shown in FIG. 3A, the etched glass 300 may have a plurality of trenches or holes 302 on a first surface. A metal 304 may then be deposited on the first surface, as shown in FIG. 3B. The metal may be deposited using any technique for depositing a metal on a substrate. The process of depositing the metal 304 of the glass 300 may leave metal not only in the plurality of trenches 302, but also on top of the first surface of the glass. The first surface of the glass 300 may be polished to remove extraneous metal, leaving metal only in the trenches 302 of the glass as shown in FIG. 3C.

FIGS. 4A-D illustrate the trenches 402 of etched, chemically strengthened glass 400 being layered with a chemically reactive combination of materials to control the fragmentation characteristics of the glass, in accordance with embodiments of the present disclosure. The chemically strengthened glass 400 may be made using any chemical strengthening process. For example, the chemically strengthened glass may be made using an ion exchange process, such as a K/Na ion exchange process that replaces sodium ions in the surface of the glass with larger potassium ions when soda lime glass is placed in potassium nitrate ($KNO_3$). In some embodiments, the ion exchange process used to strengthen the glass 400 may involve replacing the sodium ions with some other ions, such as rubidium ions.

Figure 4A:
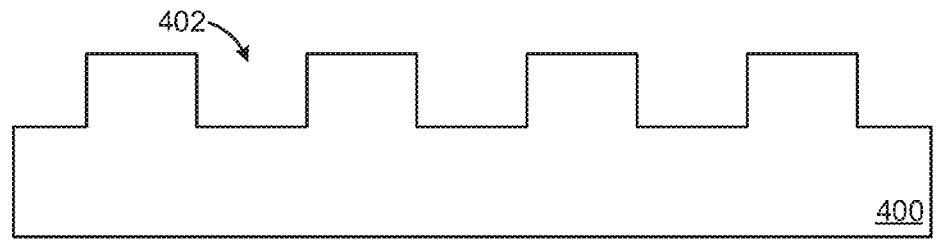
FIGS. 4A-D illustrate the trenches of etched chemically strengthened glass being layered with a chemically reactive combination of materials to control the fragmentation characteristics of the glass, in accordance with embodiments of the present disclosure.
Figure 4B:
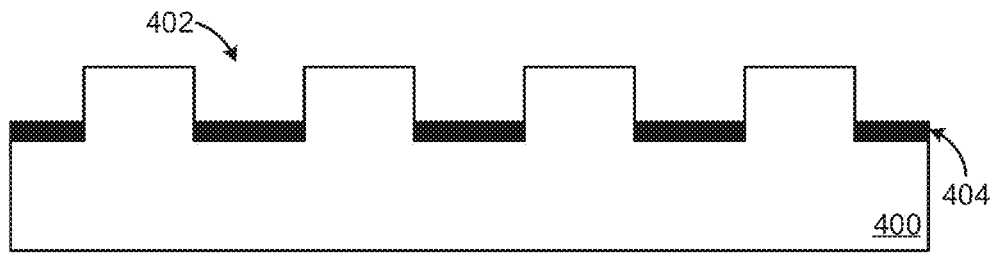
Figure 4C:
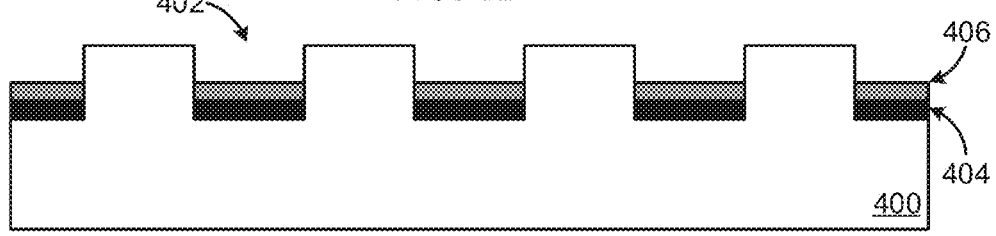
Figure 4D:
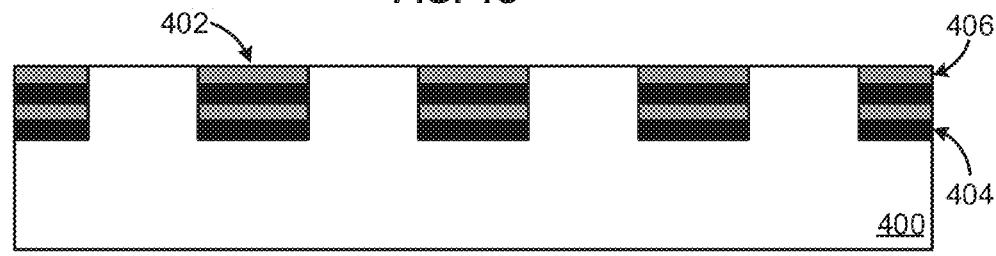

As shown in FIG. 4A, the etched glass may have a plurality of trenches or holes 402 on a first surface. A first reactive material 404 (e.g., aluminum) may be deposited in the trenches 402 of the glass 400 as shown in FIG. 4B. After a layer of the first reactive material 404 has been deposited in the trenches 402, a layer of a second reactive material 406 (e.g., nickel) may be deposited in the trenches of the glass 400 on top of the lay of the first reactive material. A diagram showing one layer of each material is shown in FIG. 4C. Another layer of the first reactive material 404 may then be deposited on top of the layer of the second reactive material 406. The process of layering the trenches with alternating reactive materials may continue until the trenches are full, as shown in FIG. 4D.

In some embodiments, such as the one shown in FIGS. 4A-D, the chemically reactive combination may involve layering two different materials (e.g., aluminum and nickel). In other embodiments, additional layers may be necessary or preferred. For example, a layer of a third material, such as an oxide, may sit on top of the layers of the two reactive materials to enhance the chemical reaction. As another example, a catalyst layer may be deposited in the trenches to increase the rate at which the reactants undergo the chemical reaction.

Figure 5:
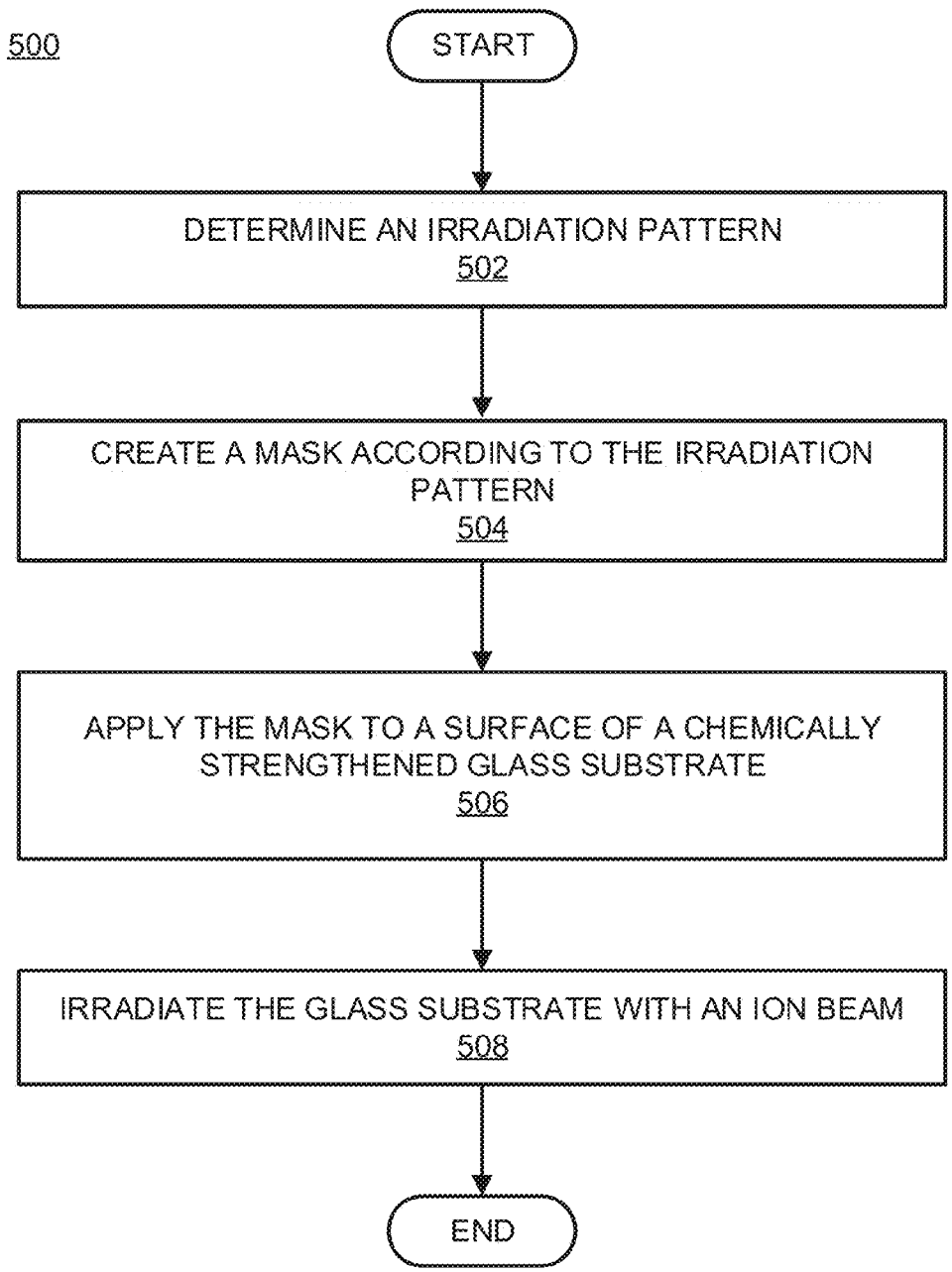
FIG. 5 illustrates a flowchart of an example method of manufacturing a chemically strengthened glass substrate to control the fragmentation characteristics of the glass substrate by masking and irradiating the glass substrate with an ion beam, in accordance with embodiments of the present disclosure.

FIG. 5 illustrates a flowchart of an example method 500 of manufacturing a chemically strengthened glass substrate to control the fragmentation characteristics of the glass substrate by masking and irradiating the glass substrate with an ion beam, in accordance with embodiments of the present disclosure. Ion beam irradiation works by depositing charged particles (ions) in a substrate. At a high enough incident energy, the ions are able to penetrate the substrate and, depending on the ions' energy, break bonds between atoms in the substrate. At lower incident energies, an ion beam may not be able to penetrate all the way through the substrate. Instead, the ions may be implanted in the substrate, creating impurities. Because the ion beam may fan out in a cone-like shape, the ion beam may have a central incidence axis, which is the axis that runs from the center of the ion emitter to the center of the area on the glass substrate that is hit by the ion beam. In some embodiments, the method 500 may be performed on a glass substrate prior to the glass substrate being chemically strengthened using an ion exchange process. The method 500 may begin at operation 502, wherein an irradiation pattern may be determined. The irradiation pattern may establish which parts of the glass substrate will be subjected to ion irradiation, and which parts of the glass substrate will be protected (or masked) from the ion irradiation.

Figure 6A:
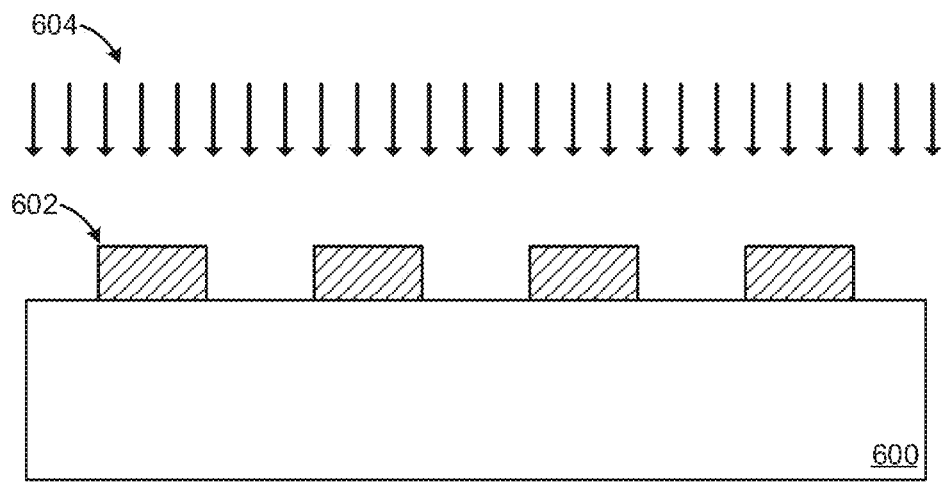
FIGS. 6A-C illustrate the process of masking and irradiating a planar sheet of chemically strengthened glass with an ion beam to control the fragmentation characteristics of the glass, in accordance with embodiments of the present disclosure.
Figure 6B:
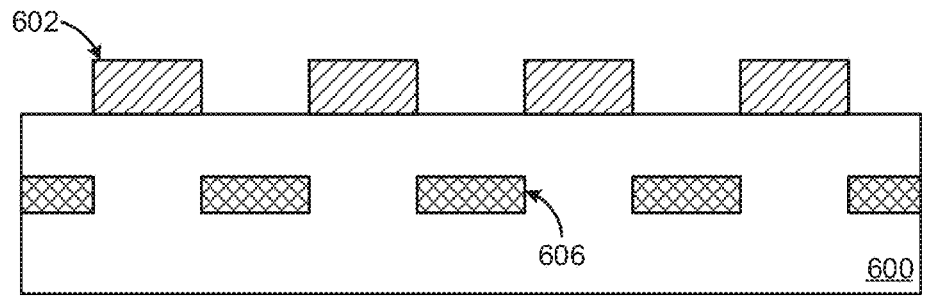
Figure 6C:
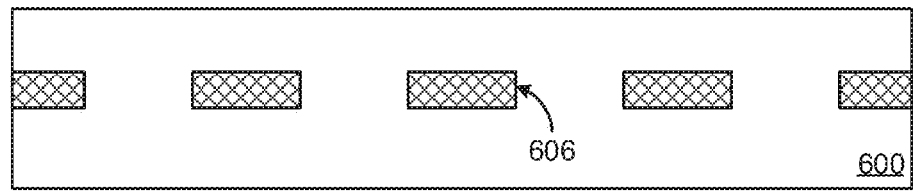

In some embodiments, the irradiation pattern may be chosen to create small pockets of damaged glass throughout the glass substrate by breaking bonds in the glass or by implanting ions in the glass. An example of using ion irradiation to create pockets of damaged glass is shown in FIG. 6A-C. The pockets of damaged glass may be made anywhere in the glass, such as in either the compressive region or the tensile region.

For example, the irradiation pattern may be chosen to break bonds and weaken the glass near the surface, in the compressive region. This may reduce the fragmentation size of the glass because the compressive region may be weaker (fewer bonds between atoms) and, therefore, more susceptible to fracturing. In some embodiments, the pockets of damaged glass may be focused at the transitional region between the tensile stress region and the compressive stress region to assist the crack in propagating towards the surface of the substrate.

In some embodiments, the irradiation pattern may be chosen to create one or more paths of damaged glass that run through the glass substrate. In some embodiments, the paths of damaged glass may tunnel through the bulk of the material. This may provide a path through which the crack may more easily propagate. In some embodiments, the damaged region may run from at or near the surface of the glass (in the compressive region) to at or near the center of the glass (in the tensile region). This may provide a path through which cracks may more easily propagate towards the surface of the glass, helping to overcome the crazing effects of the compressive region. The ion beam energy may be modulated to adjust the depth of the damage or implantation to create the path from the tensile region to the compressive region.

For example, in some embodiments, the ion beam may be raster-scanned across the masked glass surface to create a damaged region of glass at a first depth. The ion beam's energy may then be adjusted to change the depth at which the damage is done to the glass, and subsequently, the ion beam may be raster-scanned across the masked glass surface again. This process may be repeated until the ion beam has created a path of damaged glass that runs from a point in the tensile region of the substrate to a point in the compressive region of the substrate.

The irradiation pattern may be determined according to the intended use of the glass. In some embodiments, the irradiation pattern may be chosen to limit the crazing effects by damaging the compressive stress region at specific places on the glass substrate. In these embodiments, the irradiation pattern may cause most of the surface of the glass to be irradiated to damage the compressive region of the glass substrate across most of the surface. Only smaller areas of the glass, such as where the high strength created by the compressive stress region is needed to, e.g., support a chip or semiconductor, may be masked. The rest of the glass may be irradiated, thereby causing it to fracture into smaller fragments.

In some embodiments, such as where a planar glass substrate will be supported along its perimeter, as in a car window, the irradiation pattern may involve masking the edges of the glass and irradiating the rest of the planar surface. This may preserve the higher strength along the edges of the glass, while still causing the central region of the glass to fragment into smaller pieces when fractured.

Different irradiation patterns may be used to reduce the fragmentation size of the glass. In some embodiments, parallel paths of damaged glass may be created by raster-scanning the ion beam across the surface of the glass substrate. By adjusting the spacing and thickness of the damaged paths, the fragment size of the glass substrate may be controlled. For example, reducing the spacing between the damaged paths may reduce the fragmentation size.

Parallel damage paths may be particularly useful in controlling the distribution of fragmentation sizes. Unlike with disconnected features, which may be difficult to uniformly pattern throughout the glass substrate, parallel lines can be uniformly distributed across throughout a section of the glass substrate more easily. This may change the distribution of the fragmentation sizes such that a higher percentage of glass fragments are at or near a desired size, while the range and standard deviation of the size of individual glass fragments may be smaller.

There may be a critical spacing length for the damaged paths in the glass substrate. Damaged path spacing that is greater than or less than the critical spacing may result in a larger fragmentation size than damaged path spacing at the critical spacing length. Likewise, glass with narrower (and more frequent) damaged path widths may have a reduced fragmentation size when compared to glass with wider path widths. As with the path spacing, there may be a critical path width. Glass with wider or narrower damaged path widths may have a larger fragmentation size than glass with damage path widths at the critical path width.

In some embodiments, the irradiation pattern may include creating damaged glass regions in the form of disconnected features. The disconnected features may be open features (such as zig-zag or c-shaped patterns) or closed features (such as a rectangle or a star). The features may be considered disconnected because the paths of damaged glass that define the features do not cross or touch neighboring features' paths of damaged glass. Not only can the damaged regions reduce the compressive stresses as discussed herein, the use of a disconnected feature, such as a star, may help to increase the bifurcation of the crack.

For example, assume that a glass substrate is irradiated so as to create a damaged region in the shape of a five-point star. As a crack propagates through the substrate, it may intersect the star. The crack may then follow the edges of the star, cracking outward every time it reaches a point in the star, which may act like a stress concentration point. Accordingly, by changing the number of points in the star and the size of the star, the frequency of the crack bifurcation may be controlled. Decreasing the size of the star or increasing the number of points in the star may reduce the fragmentation size of the glass substrate.

In some embodiments, a glass substrate may be irradiated to create disconnected features in the substrate in order to control the fragmentation shape of the glass. Damaged regions of glass in the shapes of rectangles or stars may be generated in the glass substrate using an ion beam so that, upon fracturing, the fragments are shaped like the features, e.g., like a rectangle or star. Controlling the shape of the fragmentation may make it easier to separate the fractured glass from its environment. For example, chemically strengthened glass may be used in a pipe to hold back the flow of a fluid, such as seawater at a water desalination plant, until the pipe is connected to the desalination equipment and the plant is ready to being operations. At that point, the glass may be intentionally broken (e.g., by increasing the water pressure in the pipe). The glass may then be filtered out of the water, and by controlling the shape of the fragments of glass, it may be easier or cheaper to filter the majority of the glass out of the water.

After determining an irradiation pattern at operation 502, a mask may be created according to the irradiation pattern at operation 504. The mask may be made out of any material capable of protecting the glass substrate from the ion beam. The mask material may depend on the energy levels and types of ions used by the ion beam because some masking materials may not be able to shield the glass from ion beams with an energy level about a threshold. After creating a mask at operation 504, the mask may be applied to a surface of the glass substrate at operation 506. At operation 508, the glass substrate may be irradiated with an ion beam.

In some embodiments, the ion beam may irradiate the glass surface with hydrogen ions. In some embodiments, the ion beam may irradiate the glass substrate with heavier ions, such as gallium ions. In some embodiments, the glass substrate may be irradiated with a combination of different ions.

In some embodiments, the glass substrate (or the ion beam) may be tilted to create complex patterns of damaged glass within the substrate. The glass substrate may have more than one surface masked, or the masks may be changed during the irradiation process. For example, an ion beam may be raster-scanned across a masked surface of a glass substrate. The mask may then be removed from the surface, and a new mask may be applied to the same surface. The glass substrate may then be tilted so that the ion beam approaches the masked surface from a different angle, and the ion beam may again be raster-scanned across the masked surface. This process may be repeated to create complex paths and regions of damage within the glass substrate.

As another example, a piece of chemically strengthened glass may be masked on a first surface and a second surface, wherein the two surfaces meet at a substantially orthogonal angle (i.e., between 80 and 100 degree). The ion beam may then be raster-scanned across the first surface, creating areas of damaged glass within the substrate. The glass substrate may then be tilted 90 degrees to expose the second surface to the ion beam. The ion beam may then be raster-scanned across the second surface. This may allow more complex damage patterns, such as cross or "T" shaped patterns, to be created in the glass substrate. After the glass substrate has been irradiated, the method 500 may end.

In some embodiments, ions may be implanted in the glass substrate using an ion beam irradiation process that does not require a mask. For example, the ion beam may be raster-scanned over a section of the glass substrate, e.g., over a square or a rectangular shaped section of the glass surface. The ion beam may then be "blanked," or turned off, and the glass (or the beam) may then be mechanically translated in a direction to change the area of the glass that is targeted by the ion beam. The ion beam may then be activated again when the ion beam is directed towards the next part of the glass to be irradiated. This process may be repeated as necessary to damage the glass substrate in accordance with the irradiation pattern.

FIGS. 6A-C illustrate the process of masking and irradiating a planar sheet of chemically strengthened glass 600 with an ion beam to control the fragmentation characteristics of the glass, in accordance with embodiments of the present disclosure. The chemically strengthened glass 600 may be made using any chemical strengthening process. For example, the chemically strengthened glass may be made using an ion exchange process, such as a K/Na ion exchange process that replaces sodium ions in the surface of the glass with larger potassium ions when soda lime glass is placed in potassium nitrate ($KNO_3$). In some embodiments, the ion exchange process used to strengthen the glass 600 may involve replacing the sodium ions with some other ions, such as rubidium ions.

As shown in FIG. 6A, a mask 602 may be created to pattern the glass 600 to create an inhomogeneous stress field inside the glass. The pattern of the mask 602 may be chosen to create an inhomogeneous stress field that results in the desired fragmentation characteristics of the glass. The mask 602 may be applied to the surface of the glass 600. The surface of the glass may then be irradiated by an ion beam 604. The ion beam may use, e.g., hydrogen ions.

As shown in FIG. 6B, the ion beam irradiation 604 may penetrate the glass substrate 600 and create pockets of damaged glass 606 within the glass. The pockets of damaged glass 606 may be areas where bonds between the atoms have been broken. In some embodiments, the pockets of damaged glass 606 may be areas where ions from the ion beam 604, such as hydrogen ions, have been implanted in the glass substrate 600. After the ion beam irradiation has been performed on the glass 600, the mask 602 may be removed, leaving behind a damaged glass substrate as shown in FIG. 6C.

While shown at a particular depth and size in FIG. 6C, other depths and sizes consistent with this disclosure are contemplated, as discussed in reference to FIG. 5. Additionally, the area of damaged glass may not always have a rectangular cross-section, as shown in FIG. 6C, and the present disclosure should not be limited to damaged glass with a rectangular cross-section. The damage pattern shown in FIG. 6C is used for illustrative purposes only, and any other damage pattern that may be created by ion beams consistent with the application is contemplated. For example, in some embodiments, the cross section of the area of damaged glass may be circular. In some embodiments, the cross section of the area of damaged glass may be in the shape of a tear-drop.

Figure 7:
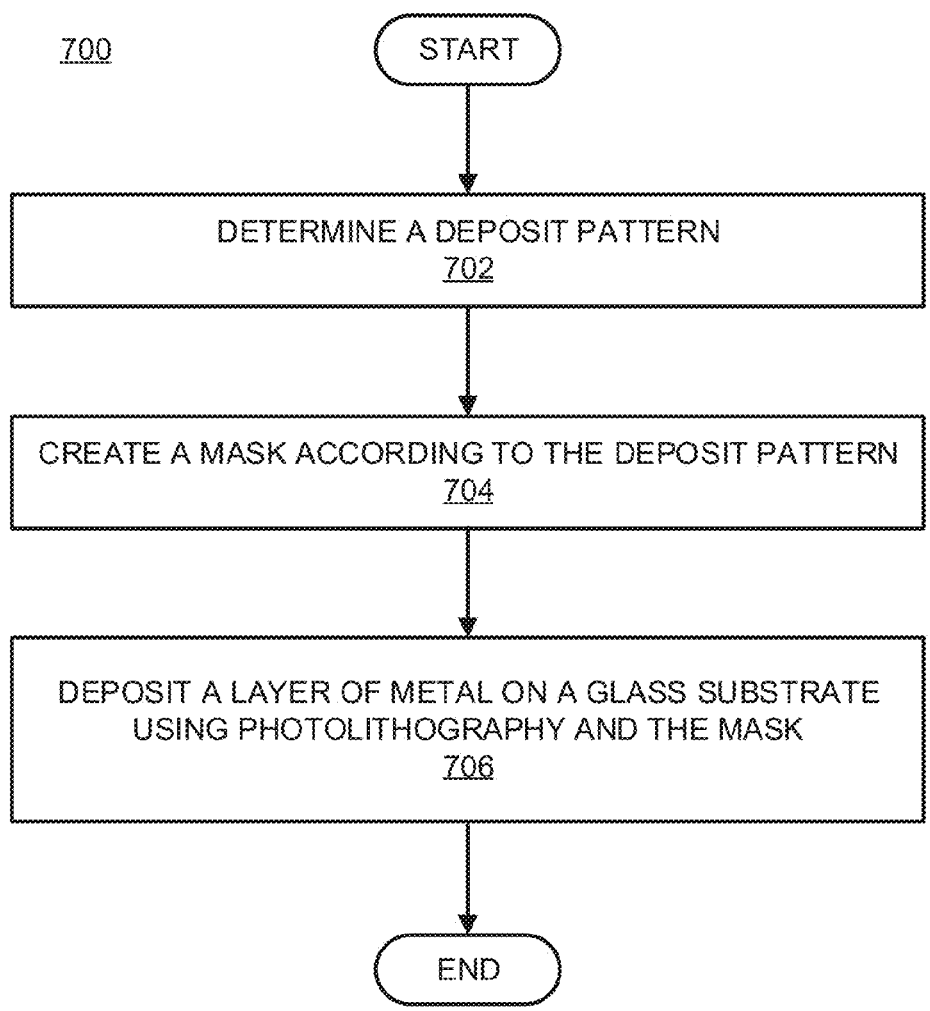
FIG. 7 illustrates a flowchart of an example method of manufacturing a chemically strengthened glass substrate to control the fragmentation characteristics of the glass substrate by depositing a metal layer on top of the glass substrate using a photolithography process to modify the stress field of the glass, in accordance with embodiments of the present disclosure.

FIG. 7 illustrates a flowchart of an example method 700 of manufacturing a chemically strengthened glass substrate to control the fragmentation characteristics of the glass substrate by depositing a metal layer on top of the glass substrate using a photolithography process to modify the stress field of the glass, in accordance with embodiments of the present disclosure. In some embodiments, the method 700 may be performed on a glass substrate prior to the glass substrate being chemically strengthened using an ion exchange process. The method 700 may begin at operation 702, wherein a deposit pattern may be determined. The deposit pattern establishes which parts of the glass substrate will have a layer of metal deposited on top, and which parts of the metal layer will be etched away.

Layers of metal deposited on the surface of a glass substrate change the stress field within the substrate, particularly at and near the surface where the metal is deposited. This may be caused by, e.g., the weight of the metal and the bonding between the metal and the glass substrate. By selectively depositing metal according to pattern, the stress field of the glass may be modified to change the fragmentation characteristics of the glass. Because the metal is deposited on the surface, where residual compressive stresses are located in chemically strengthened glass, selectively depositing the metal layer may be particularly useful in minimizing the crazing effects of the compressive stress region. The deposited metal may also provide a path, predominantly at the edges of the metal-glass bond, for cracks to follow.

In embodiments, several deposit patterns may be used to control the fragmentation size of the glass. In some embodiments, parallel lines of metal may be deposited across the surface of the glass substrate. By adjusting the spacing and thickness of the lines, the fragment size of the glass substrate may be controlled. For example, reducing the spacing between the lines may reduce the fragmentation size. For some metals, there may be a critical spacing length, which is the spacing between deposited lines of metal that results in the smallest fragmentation size. Line spacing that is greater than or less than the critical spacing may result in larger fragmentation size than line spacing at the critical spacing length. Likewise, glass with narrower (and more frequent) lines may have a reduced fragmentation size when compared to glass with wider lines. As with the line spacing, there may be a critical line width. Glass with wider or narrower deposit line widths may have a larger fragmentation size than glass with line widths at the critical line width.

Parallel lines of deposited metal may be particularly useful in controlling the distribution of fragmentation sizes. Unlike with disconnected features, which may be difficult to uniformly pattern across the surface of the glass, parallel lines can be uniformly distributed across the surface of the glass substrate. This may change the distribution of the fragmentation sizes such that a higher percentage of glass fragments are at or near a desired size, while the range and standard deviation of the size of individual glass fragments may be smaller.

In some embodiments, the deposit pattern may include depositing lines to form disconnected features on the surface of the glass substrate. The disconnected features may be open features (such as zig-zag or c-shaped patterns) or closed features (such as a rectangle or a star). The features may be considered disconnected because the deposited metal that defines the features do not cross or touch neighboring features. The depositing of metal in the shape of a disconnected feature, such as a star, may help to increase the bifurcation of the crack. For example, assume that a five-point star is deposited onto the surface of a glass substrate. As a crack propagates along the surface of the substrate, it may intersect the star. The crack may then follow the edges of the star, cracking outward every time it reaches a point in the star, which may act like a stress concentration point. Accordingly, by changing the number of points in the star and the size of the star, the frequency of the crack bifurcation may be controlled. Decreasing the size of the star or increasing the number of points in the star may reduce the fragmentation size of the glass substrate.

In some embodiments, metal in the shape of disconnected features may be deposited onto the surface in order to control the fragmentation shape of the glass. Shapes like rectangles or stars may be deposited onto the glass surface so that, upon fracturing, the fragments are shaped like the features, e.g., like a rectangle or star. Controlling the shape of the fragmentation may make it easier to separate the fractured glass from its environment. For example, chemically strengthened glass may be used in a pipe to hold back the flow of a fluid, such as seawater at a water desalination plant, until the pipe is connected to the desalination equipment and the plant is ready to being operations. At that point, the glass may be intentionally broken (e.g., by increasing the water pressure in the pipe). The glass may then be filtered out of the water, and by controlling the shape of the fragments of glass, it may be easier or cheaper to filter the majority of the glass out of the water.

After determining the deposit pattern at operation 702, a mask may be created according to the deposit pattern at operation 704 and a layer of metal may be deposited and patterned on the glass substrate using a photolithography technique at operation 706. The mask may be created using a photoresist and a photomask. For example, a photoresist may be deposited on top of the layer of metal. Light may be used to shape the photoresist according to the deposit pattern. After the photoresist has been shaped in accordance with the deposit pattern, the surface may be etched to shape the metal on the glass substrate's surface. The photoresist may then be removed.

In some embodiments, the metal layer may be removed from the surface of the glass substrate. For example, the layer of metal may serve to impart additional stresses on the glass surface, changing the stress pattern in the glass, and afterwards may be removed. As another example, after adding a metal layer to the glass substrate, the glass may again undergo an ion exchange process, with the layer of metal shielding selected areas of the glass from the chemically strengthening process. The layer of metal may then be removed, leaving behind a glass substrate with an inhomogeneous stress field caused by the uneven ion exchange at the surface of the glass substrate.

Figure 8A:
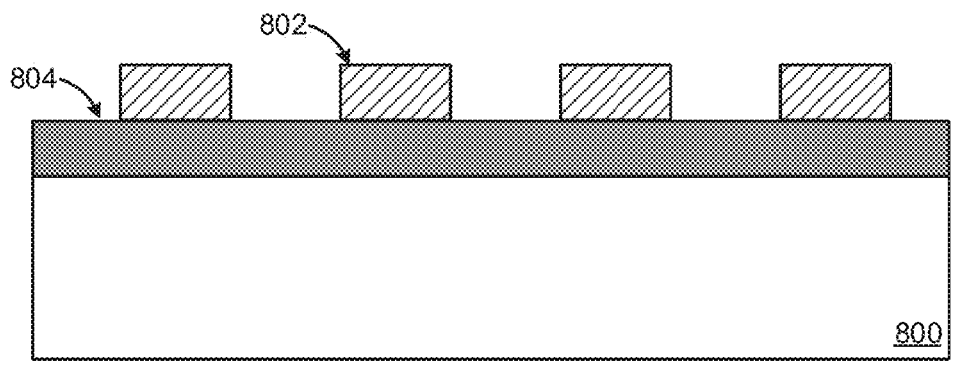
FIGS. 8A-C illustrate the process of depositing a metal layer on top of a planar sheet of chemically strengthened glass using photolithography to control the fragmentation characteristics of the glass, in accordance with embodiments of the present disclosure.
Figure 8B:
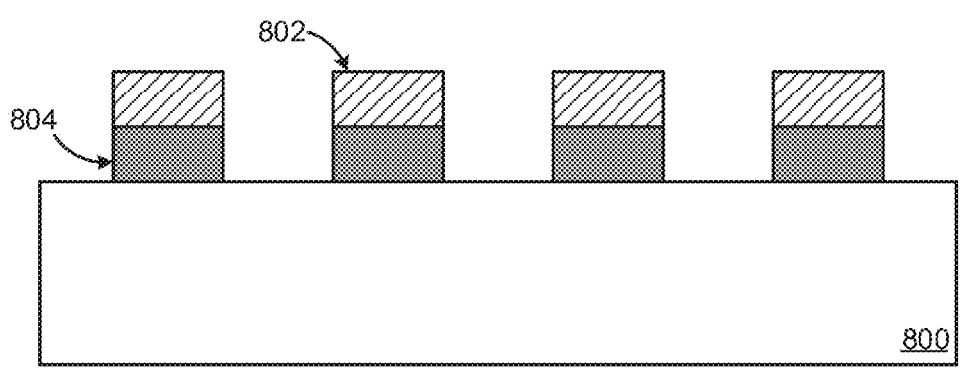
Figure 8C:
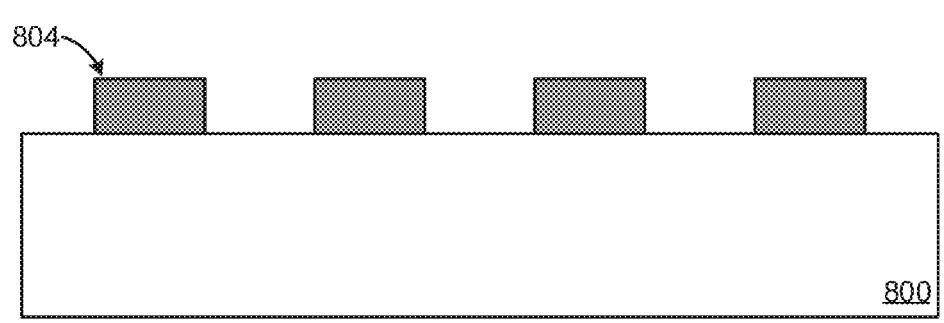

FIGS. 8A-C illustrate the process of depositing a metal layer 804 on top of a planar sheet of chemically strengthened glass 800 using photolithography to control the fragmentation characteristics of the glass, in accordance with embodiments of the present disclosure. The chemically strengthened glass 800 may be made using any chemical strengthening process. For example, the chemically strengthened glass 800 may be made using an ion exchange process, such as a K/Na ion exchange process that replaces sodium ions in the surface of the glass with larger potassium ions when soda lime glass is placed in potassium nitrate ($KNO_3$). In some embodiments, the ion exchange process used to strengthen the glass 800 may involve replacing the sodium ions with some other ions, such as rubidium ions.

As shown in FIG. 8A, a layer of metal 804 may be deposited on a first surface of the chemically strengthened glass 800. A mask 802 may be selectively applied on top of the metal layer 804. The mask 802 may be applied using known photolithography techniques. The layer of metal 804 may then be etched as shown in FIG. 8B. The mask 802 may then be removed, leaving a glass substrate 800 with metal 804 deposited according to a deposit pattern on the first surface, as shown in FIG. 8C.

Figure 9A:
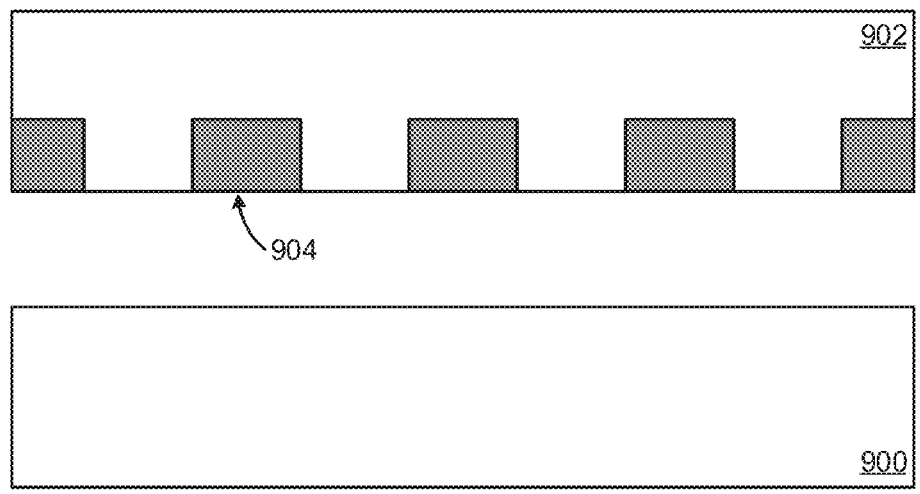
FIGS. 9A-B illustrate the process of bonding a patterned glass substrate to a chemically strengthened glass substrate to control the fragmentation characteristics of the glass substrate, in accordance with embodiments of the present disclosure.
Figure 9B:
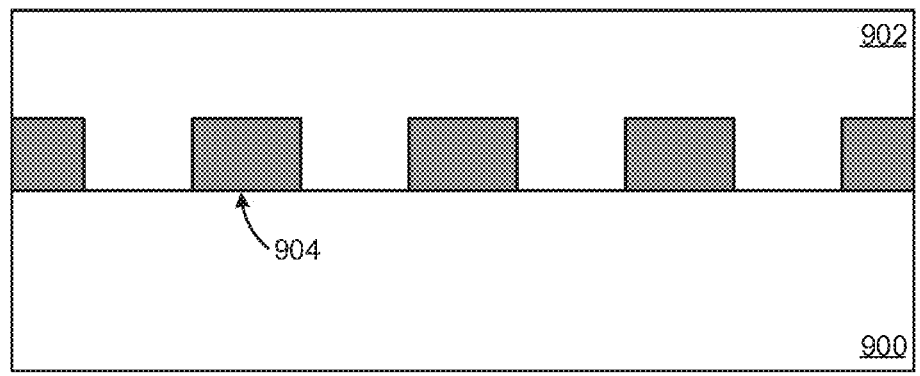

FIGS. 9A-B illustrate the process of bonding a patterned glass substrate 902 to a chemically strengthened glass substrate 900 to control the fragmentation characteristics of the combined glass substrate, in accordance with embodiments of the present disclosure. The chemically strengthened glass 900 may be made using any chemical strengthening process. For example, the chemically strengthened glass 900 may be made using an ion exchange process, such as a K/Na ion exchange process that replaces sodium ions in the surface of the chemically strengthened glass 900 with larger potassium ions when soda lime glass is placed in potassium nitrate ($KNO_3$). In some embodiments, the ion exchange process used to strengthen the glass 900 may involve replacing the sodium ions with some other larger ions, such as rubidium ions.

The patterned glass substrate 902 may be any type of glass, such as float glass, tempered glass, or chemically strengthened glass. The patterned glass 902 may be patterned using any technique to control the fragmentation characteristics of the patterned glass, such as the techniques described in this disclosure. For example, as shown in FIGS. 9A and 9B, the patterned glass 902 may be etched to create trenches, and the trenches may be filled with a metal 904.

The patterned glass 902 may be bonded to the chemically strengthened glass 900 using any glass bonding technique. For example, the patterned glass 902 may be bonded to the chemically strengthened glass 900 using low temperature frit bonding, also known as glass soldering or seal glass bonding. In low temperature frit bonding, the surface of either the patterned glass 902 or the chemically strengthened glass 900 may be heated up. This decreases the viscosity of the heated glass. When the heated glass reaches the wetting temperature, the heated glass is soft enough and liquid enough to flow and wet the surface of the other glass surface. The liquid glass flows into the small imperfections at the surface of the colder glass, creating a tight seal. When the glass is allowed to cool, it re-solidifies to create a hermetically sealed bond between the two glass surfaces.

Alternatively, the glasses 900 and 902 may be bonded using a sodium silicate bonding agent, or using anodic bonding (also known as electric field bonding). For example, a sodium silicate bonding process may involve spinning a 2% sodium silicate solution onto a surface of one of the glass substrates at 1500 rpm for 20 seconds to deposit an ultrathin, uniform layer of sodium silicate on the glass surface. The two glass substrate may then be brought into contact with each other and manually tacked together using a hard rod. The substrates may be held together with a force of between, e.g., 10 psi and 3000 psi. The glass substrates may then be baked as necessary.

As another example, an anodic bonding process may be used to bond the two glass substrates together. The surfaces to be bonded together may be cleaned with acetone, and the surfaces may be brought in to contact. A voltage may then be applied across the surfaces to be bound, and the glass substrates may be held together with between 40 psi and 50 psi of pressure. Heat may also be applied to the glass to increase the temperature at the bonding site. Other glass-to-glass bonding techniques as known to one of ordinary skill in the art may also be used.

What is claimed is:

1. A method of manufacturing a glass substrate to control fragmentation characteristics of the glass substrate, the method comprising:
    determining an etching pattern, the etching pattern being configured to control a fragmentation size of a glass substrate by modifying a stress field within the glass substrate to create an inhomogeneous stress field;
    masking a first surface of the glass substrate according to the etching pattern, the glass substrate being chemically strengthened glass, the glass substrate having an exterior region and an interior region, wherein the exterior region has residual compressive stresses and the interior region has residual tensile stresses;
    etching an unmasked portion of the first surface to produce a plurality of trenches in the first surface; and
    filling the plurality of trenches with a filler material to generate the inhomogeneous stress field in the glass substrate.

2. The method of claim 1, wherein determining the etching pattern includes:
    determining a desired fragmentation size of the glass substrate, the desired fragmentation size of the glass substrate being less than 250 micrometers, the desired fragmentation size being an average of a width of a plurality of fragments created when the glass substrate fractures; and
    selecting the etching pattern based on the desired fragmentation size, wherein the etching pattern defines locations of the plurality of trenches in the glass substrate.

3. The method of claim 1, the method further comprising bonding the glass substrate to a second glass substrate.

4. The method of claim 1, wherein filling the plurality of trenches with the filler material to generate the inhomogeneous stress field in the glass substrate includes:
    filling the plurality of trenches with a metal filler, the metal filler being at a temperature sufficient to cause the metal to bond with the glass substrate at the boundaries of the trenches; and
    cooling the metal filler.

5. The method of claim 1, wherein the filler material is a composition of aluminum and nickel, the filler material having a metal filament inserted therein, the method further comprising:
    determining that the chemical reaction should be initiated; and
    running a current through the metal filament, wherein the current is large enough to cause the metal filament to heat up to a temperature sufficient to initiate a chemical reaction between the aluminum and the nickel.

6. The method of claim 1, wherein determining the etching pattern includes:
    choosing the filler material;
    determining a desired fragmentation size of the glass substrate; and
    selecting, based on the chosen filler material and the desired fragmentation size, the etching pattern from a plurality of etching patterns, wherein the etching pattern defines locations of the plurality of trenches in the glass substrate, the selected etching pattern being configured to cause the glass substrate to fracture such that an average of a width of a plurality of fragments created when the glass substrate fractures is less than or equal to the desired fragmentation size.

7. The method of claim 1, wherein the chemically strengthened glass was strengthened using a potassium and sodium (K/Na) ion exchange process, wherein trenches of the plurality of trenches are spaced approximately 20 micrometers apart, wherein each trench of the plurality of trenches is approximately 15 micrometers across, and wherein the filler material is aluminum.

8. A method of manufacturing a glass substrate to control fragmentation characteristics of the glass substrate, the method comprising:
    determining a deposit pattern, the deposit pattern being configured to control a fragmentation size of a glass substrate, the glass substrate being chemically strengthened glass, the glass substrate having an exterior region and an interior region, wherein the exterior region has residual compressive stresses and the interior region has residual tensile stresses;
    depositing a layer of metal on top of a first surface of the glass substrate;

patterning, using a photolithography process, the layer of metal according to the deposit pattern to create an inhomogeneous stress field within the substrate.

9. The method of claim 8, the method further comprising bonding the glass substrate to a second glass substrate.

10. The method of claim 8, wherein determining a deposit pattern comprises:
determining a desired fragmentation size of the glass substrate; and
selecting, based on the desired fragmentation size, the deposit pattern from a plurality of deposit patterns, wherein the deposit pattern establishes which parts of the first surface of the glass substrate will have a layer of metal deposited on top.

11. A method of manufacturing a glass substrate to control fragmentation characteristics of the glass substrate, the method comprising:
determining a irradiation pattern, the irradiation pattern being configured to control a fragmentation size of a glass substrate, the glass substrate being chemically strengthened glass, the glass substrate having an exterior region and an interior region, wherein the exterior region has residual compressive stresses and the interior region has residual tensile stresses;
applying a first mask to a first surface of the glass substrate according to the irradiation pattern; and
irradiating the glass substrate using an ion beam, wherein the ion beam is configured to emit ions towards the first surface of the glass substrate.

12. The method of claim 11, the method further comprising:
applying a second mask to a second surface of the glass substrate according to irradiation pattern, wherein the second surface is substantially orthogonal to the first surface; and
irradiating the glass substrate using the ion beam by emitting ions towards the second surface of the glass substrate.

13. The method of claim 11, the method further comprising:
changing an angle between the first surface and a central incidence axis of the ion beam; and
irradiating the glass substrate a second time using the ion beam.

14. The method of claim 11 wherein the irradiation pattern is configured to cause the ion beam irradiation to create a path of damaged glass in the glass substrate.

15. The method of claim 14, wherein the path of damaged glass runs from a first point in the interior region of the glass substrate to a second point in the exterior region of the glass substrate, and wherein the irradiating the glass substrate using an ion beam comprises:
irradiating the glass substrate using the ion beam with a first energy to create a first damaged region at a first depth;
changing the energy of the ion beam from the first energy to a second energy; and
irradiating the glass substrate using the ion beam with a second energy to create a second damaged region at a second depth, wherein the first and second damaged regions form a path from the first point to the second point.

16. The method of claim 11, the method further comprising bonding the glass substrate to a second glass substrate.

17. The method of claim 11, wherein the irradiation pattern includes one or more disconnected features.

18. The method of claim 11, wherein the irradiating the glass substrate using an ion beam comprises raster-scanning the ion beam over a portion of the first surface of the glass substrate.

19. The method of claim 11, wherein determining an irradiation pattern comprises:
determining a desired fragmentation size of the glass substrate; and
selecting, based on the desired fragmentation size, the irradiation pattern from a plurality of irradiation patterns, wherein the irradiation pattern defines parts of the glass substrate to subject to ion irradiation.

20. The method of claim 11, wherein the irradiating the glass substrate using the ion beam comprises:
creating pockets of damaged glass in a transitional region between the exterior region that has residual compressive stresses and an interior region that has residual tensile stresses.

* * * * *